United States Patent
Yoon et al.

(10) Patent No.: US 7,902,738 B2
(45) Date of Patent: Mar. 8, 2011

(54) ORGANIC LIGHT EMITTING DEVICE HAVING FIRST AND SECOND LIGHT EMITTING MEMBERS

(75) Inventors: Choon-Sup Yoon, Daejeon (KR); Sang-Jin Ahn, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 714 days.

(21) Appl. No.: 11/843,830

(22) Filed: Aug. 23, 2007

(65) Prior Publication Data

US 2008/0048571 A1 Feb. 28, 2008

(30) Foreign Application Priority Data

Aug. 24, 2006 (KR) .................. 10-2006-0080474

(51) Int. Cl.
*H01J 1/64* (2006.01)
(52) U.S. Cl. .................. 313/498; 313/503
(58) Field of Classification Search .......... 313/498, 313/503, 504; 252/301.4 R
See application file for complete search history.

(56) References Cited

U.S. PATENT DOCUMENTS

| | | | |
|---|---|---|---|
| 6,010,796 A | 1/2000 | Kijima | |
| 6,572,987 B2 | 6/2003 | Seo | |
| 7,583,021 B2 * | 9/2009 | Mikami et al. | 313/504 |
| 2003/0168972 A1 * | 9/2003 | Hamada et al. | 313/504 |
| 2004/0247934 A1 * | 12/2004 | Takeuchi et al. | 428/690 |
| 2005/0214575 A1 | 9/2005 | Igarashi et al. | |
| 2006/0066225 A1 * | 3/2006 | Kishino et al. | 313/504 |
| 2006/0214596 A1 * | 9/2006 | Miller et al. | 315/169.3 |
| 2006/0244372 A1 * | 11/2006 | Mikami et al. | 313/506 |

FOREIGN PATENT DOCUMENTS

| | | |
|---|---|---|
| JP | 2002-050483 | 2/2002 |
| JP | 2002-280177 | 9/2002 |
| JP | 2004-214180 | 7/2004 |
| JP | 2005-026210 | 1/2005 |
| JP | 2005-255986 | 9/2005 |
| KR | 2002-0019534 | 3/2002 |
| KR | 1020030084712 | 11/2003 |
| KR | 100448184 | 9/2004 |
| KR | 1020040086599 | 10/2004 |
| KR | 100495594 | 6/2005 |

* cited by examiner

*Primary Examiner* — Peter Macchiarolo
(74) *Attorney, Agent, or Firm* — F. Chau & Associates LLC (57) ABSTRACT

An organic light emitting diode (OLED) display including a first electrode formed on a substrate, a second electrode facing the first electrode, first light emitting members disposed between the first electrode and the second electrode and emitting light included in a visible spectrum, and second light emitting members being in contact with the first light emitting members and emitting light having a wavelength. The wavelength is in a range of about 600 nm to about 2500 nm.

13 Claims, 11 Drawing Sheets

ORGANIC LIGHT EMITTING DEVICE HAVING FIRST AND SECOND LIGHT EMITTING MEMBERS

CROSS-REFERENCE TO RELATED APPLICATION

This application claims priority to Korean Patent Application No. 10-2006-0080474 filed in the Korean Intellectual Property Office on Aug. 24, 2006, the entire contents of which are incorporated herein by reference.

BACKGROUND OF THE INVENTION (a) Technical Field

The present invention relates to an organic light emitting device (OLED).

(b) Discussion of the Related Art

Trends toward lightweight and thin personal computers and televisions sets also require lightweight and thin display devices, and flat panel displays satisfying such requirements have been substituted for conventional cathode ray tubes (CRT).

The flat panel displays include, for example, a liquid crystal display (LCD), a field emission display (FED), an organic light emitting device (OLED), and a plasma display panel (PDP). OLEDs consume low power, and have a fast response time, a wide viewing angle, and a high contrast ratio.

An OLED is a self-emissive display device that includes two electrodes and an organic light emitting layer interposed between the two electrodes. One of the two electrodes injects holes and the other of the two electrodes injects electrons into the light emitting layer. The injected electrons and holes are combined to form excitons, and the excitons release energy in the form of emitted light.

Excitons are divided into singlet excitons and triplet excitons based on a spin state, and the singlet excitons mainly participate in light emission.

The efficiency of light emission is defined by the efficiency of a light emitting material, the internal quantum efficiency, and the external quantum efficiency. The internal quantum efficiency is a ratio of the number of photons generated in the organic light emitting layer to the number of charges injected from the electrodes, while the external quantum efficiency is a ratio of the number of photons emitted externally to the number of photons generated in the organic light emitting layer.

The internal quantum efficiency is defined by yield of the singlet excitons generated in the organic light emitting layer.

However, since the ratio of the generated singlet excitons and triplet excitons is quantum-statistically about 1:3, the maximum amount of the singlet excitons of the total generated excitons, which participate in the light emitting, is about 25%.

SUMMARY OF THE INVENTION

According to an embodiment of the present invention, an OLED includes a first electrode formed on a substrate, a second electrode facing the first electrode, first light emitting members disposed between the first electrode and the second electrode and emitting light included in a visible ray spectrum, and second light emitting members being in contact with the first light emitting members and emitting light having a wavelength. The wavelength is in a range of about 600 nm to about 2500 nm.

The second light emitting members may be formed in parallel to the first electrode or the second electrode.

The first light emitting members may be disposed between neighboring second light emitting members.

Each of the second light emitting members may include a compound semiconductor.

The compound semiconductor may include at least one of InN, GaAs, GaInAs, InP, GaSb, $(Al_xGa_{1-x})_{0.5}In_{0.5}P$, $(Al_xGa_{1-x})_yIn_{1-y}P$, $Al_xIn_{1-x}P$, and $Ga_xIn_1$.

Each of the second light emitting members may further include a first auxiliary layer disposed between the first electrode and the compound semiconductor and a second auxiliary layer disposed between the second electrode and the compound semiconductor.

The first auxiliary layer may include at least one of B, Al, Ca, In, and Tl, and the second auxiliary layer comprises at least one of N, P, As, Sb, and Bi.

The first light emitting members and the second light emitting members may be formed in a mixed configuration.

Each of the second light emitting members may include a light emitting impurity.

The light emitting impurity may include a quantum dot or a light emitting pigment.

The quantum dot may include at least one of CdSe, CdTe, ZnS, CdS, PdS, PbSe, and CdHgTe.

The first light emitting members and the second light emitting members may be formed by a solution process.

The OLED may further include first and second signal lines intersecting each other, a first thin film transistor connected to the first and second signal lines, and a second thin film transistor connected to the first thin film transistor and the first electrode. The first and second signal lines and the first and second thin film transistors may be formed between the substrate and the first electrode.

BRIEF DESCRIPTION OF THE DRAWINGS

The present invention will become more apparent by describing exemplary embodiments thereof in more detail in reference to the accompanying drawings, in which.

DETAILED DESCRIPTION OF EMBODIMENTS

The present invention will be described more fully hereinafter with reference to the accompanying drawings, in which exemplary embodiments of the inventions invention are shown. This invention may, however, be embodied in many different forms and should not be construed as limited to the embodiments set forth herein.

It will be understood that when an element such as a layer, film, region, or substrate is referred to as being "on" another element, it can be directly on the other element or intervening elements may also be present. An OLED according to an exemplary embodiment of the present invention will be described with reference to FIGS. 1 and 2.

Figure 1:
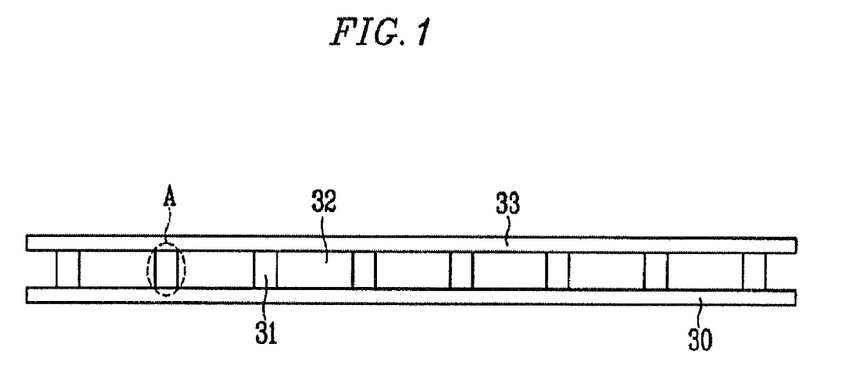
FIG. 1 is a sectional view of a passive matrix OLED according to an embodiment of the present invention.
Figure 2:
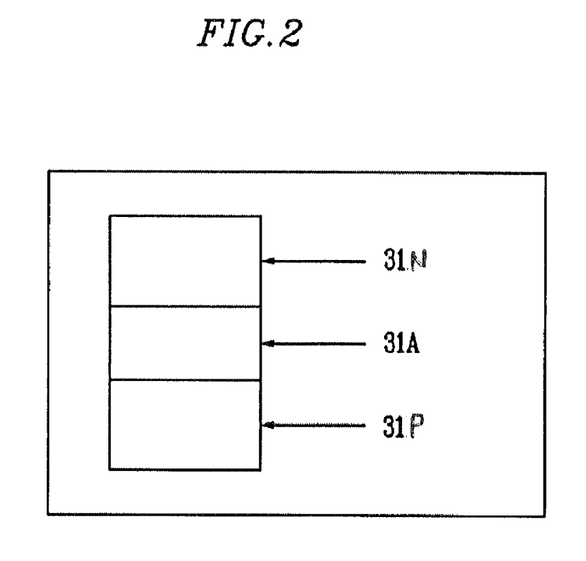
FIG. 2 is an enlarged schematic diagram with respect to portion "A" of the OLED shown in FIG. 1 according to an embodiment of the present invention.

FIG. 1 is a sectional view of a passive matrix OLED according to an embodiment of the present invention, and FIG. 2 is an enlarged schematic diagram with respect to portion "A" of the OLED shown in FIG. 1.

A lower electrode 30 is formed on an insulating substrate (not shown) made of a material such as transparent glass or plastic. The lower electrode 30 extends along a direction of the substrate. The lower electrode 30 may be made of a transparent conductive material such as, for example, ITO, or IZO.

A plurality of first light emitting members 32 and a plurality of second light emitting members 31 are formed on the lower electrode 30. The first light emitting members 32 and the second light emitting members 31 are alternately disposed in a transverse direction and are in contact with each other.

Each of the first light emitting member 32 may have a multi-layered structure including an emitting layer (not shown) for emitting light and auxiliary layers (not shown) for improving the efficiency of light emission of the emitting layer.

The light emitting layers are can be made of, for example, organic materials and mixtures of the organic materials and an inorganic material representing light in a visible spectrum, such as the three primary colors of red, green, and blue.

Examples of the organic materials or the mixtures may be low molecular weight compounds such as aluminum tris(8-hydroxyquinoline) (Alq3), anthracene, and a distryl compound, high molecular weight compounds such as a polyfluorene derivative, a (poly)paraphenylenevinylene derivative, a polyphenylene derivative, polyvinylcarbazole, or a polythiophene derivative, or compounds in which pigments are doped to the high molecular weight compounds. Examples of the pigments may be a perylene pigment, a cumarine pigment, a rhodamine pigment, rubrene, perylene, 9,10-diphenylanthracene, tetraphenylbutadiene, Nile red, coumarin, and quinacridone. The OLED displays images by spatially adding the monochromatic primary color light emitted from the light emitting layers.

The auxiliary layers may include an electron transport layer (not shown) and a hole transport layer (not shown) for improving the balance of the electrons and holes and an electron injecting layer (not shown) and a hole injecting layer (not shown) for improving the injection of the electrons and holes. There may be one or more of the auxiliary layers.

Referring to FIG. 2, each of the second light emitting members 31 includes a lower auxiliary layer 31P, an active layer 31A, and an upper auxiliary layer 31N. The lower auxiliary layer 31P, the active layer 31A, and the upper auxiliary layer 31N may have a compound semiconductor junction structure.

The lower auxiliary layer 31P may include a P type semiconductor material such as B, Al, Ga, In, and Tl.

The upper auxiliary layer 31N may include an N type semiconductor material such as N, P, As, Sb, and Bi.

The active layer 31A may have a superlattice structure in which layers including a P type (group XIII) element and layers including an N type (group XV) element are alternately laminated, and may be made of a compound semiconductor such as InN, GaAs, GaInAs, InP, GaSb, $(Al_xGa_{1-x})_{0.5}In_{0.5}P$, $(Al_xGa_{1-x})_yIn_{1-y}P$, $Al_xIn_{1-x}P$, or $Ga_xIn_{1-x}P$.

The active layer 31A emits light included in a red or infrared ray spectrum having wavelengths between about 600 nm to about 2500 nm. The wavelengths may be obtained by controlling the lattice constant of the active layer 31A, which is changed in accordance with a period of the superlattice structure, the mixing ratio of a group XIII element and a group XV element, and the kind and concentration of an impurity (see e.g. "Electronic and optoelectronic properties of semiconductor structures"—J. Singh, Cambridge University Press 2003 <ISBN 0 521 82379X>).

The second light emitting members 31 may be formed by a vacuum evaporation process. The first light emitting members 32 may be formed by a vacuum evaporation process or may be formed by a solution process such as an inkjet printing process using the second light emitting members 31 as banks.

An upper electrode 33 is formed on the first light emitting members 32 and the second light emitting members 31. The upper electrode 33 may be a conductive material in which electrons are easily injected and that does not influence the organic materials. Examples of the conductive materials may be Al, Ca, and Ba.

The lower electrode 30 may function as an anode and the upper electrode 33 may function as a cathode, or vice versa.

A light emitting mechanism of the OLED according to an embodiment of the present invention will be described with reference to FIGS. 3 and 4.

Figure 3:
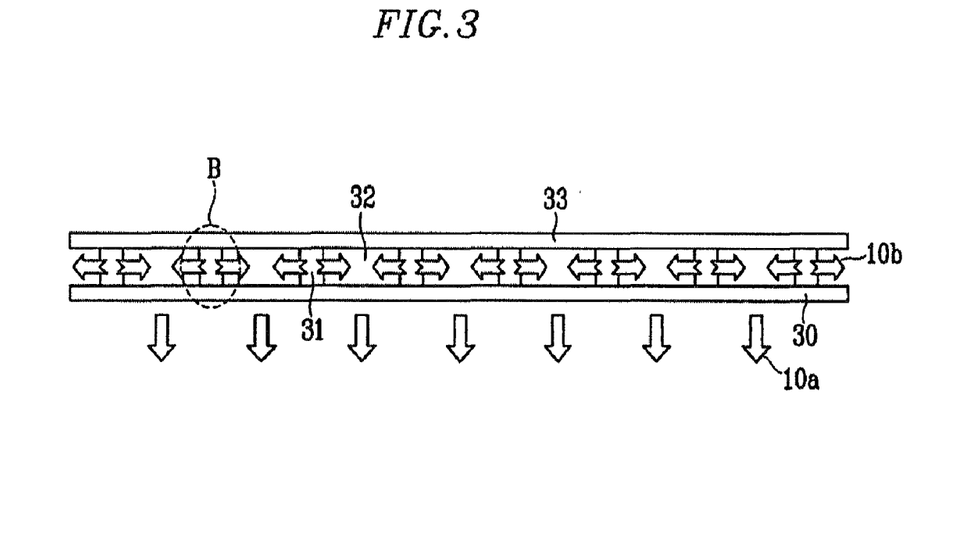
FIG. 3 is a schematic diagram showing the light emitting state of the OLED shown in FIGS. 1 and 2 according to an embodiment of the present invention.
Figure 4:
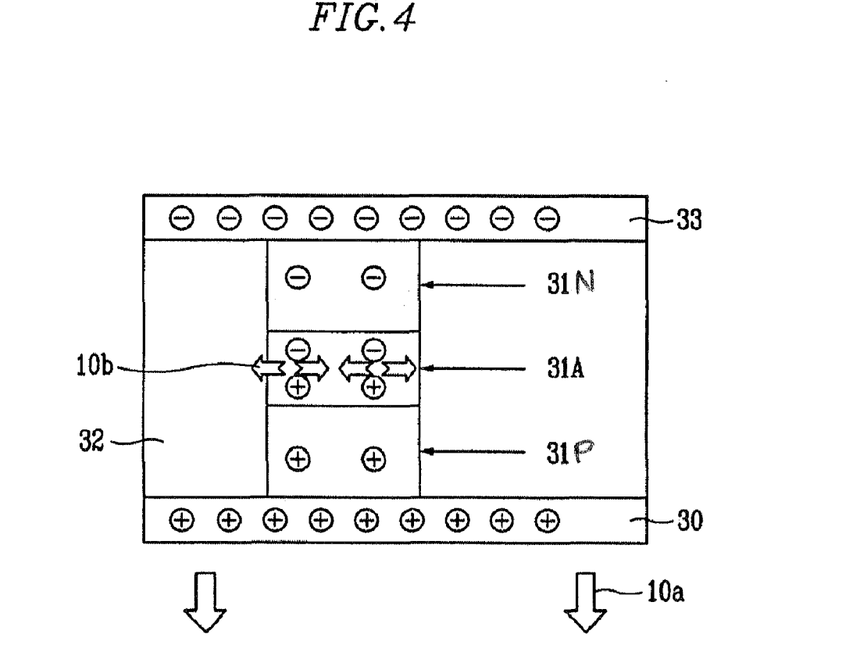
FIG. 4 is an enlarged schematic diagram with respect to portion "B" of the OLED shown in FIG. 3 according to an embodiment of the present invention.

FIG. 3 is a schematic diagram showing the light emitting state of the OLED shown in FIGS. 1 and 2, and FIG. 4 is an enlarged schematic diagram with respect to portion "B" of the OLED shown in FIG. 3.

As described above, the first light emitting members 32, emitting light having a wavelength included in a visible ray spectrum, and the second light emitting members 31, emitting light such as an infrared rays having a wavelength included in a long wavelength spectrum, are alternately disposed between the lower electrode 30 and the upper electrode 33 in the transverse direction.

In the structure, when voltages are applied to the lower electrode 30 and the upper electrode 33, respectively, holes (⊕) are injected from the lower electrode 30 to the first light emitting members 32 and the second light emitting members 31, and electrons (⊖) are injected from the upper electrode 33 to the first light emitting members 32 and the second light emitting members 31.

The holes and the electrons injected to the first light emitting members 32 are combined to form excitons, and the excitons release energy in the form of emitted light 10a included in the visible ray spectrum. The generated excitons may be divided into singlet excitons, of which a spin state is "0," and triplet excitons, of which a spin state is "1."

The generation ratio of the singlet excitons to the triplet excitons is quantum-statistically about 1:3.

When each of the excitons reaches a stable state in which it releases energy, the exciton is localized into a molecule. The exciton in this state is referred to as a bound exciton. The bound exciton releases energy as emitted light, and then disappears. The phenomenon of emitting light as the singlet excitons disappear is referred to as fluorescence, and the phenomenon of emitting light as the triplet bound excitons disappear is referred to as phosphorescence.

When excitons come to be in an unstable state by being supplied with energy, the excitons interact with the surrounding excitons. The surrounding excitons are referred to as charge transfer excitons.

The holes and electrons moved into the second light emitting members 31 combine to form excitons. The excitons release energy in the form of emitted light 10b having of a wavelength of about 600 nm to about 2500 nm. At this time, the released energy is transmitted to the first light emitting members 32, thereby increasing yield of the singlet excitons. Alternatively, the released energy may function to increase yield of the triplet excitons.

According to an embodiment, the OLED includes the second light emitting members 31 supplying predetermined energy to the first light emitting members 32, and thereby the generation rate of the singlet excitons increases. Alternatively, the generation rate of the triplet excitons may increase.

The description of how the generation rates of the singlet and triplet excitons are incremented will be described with reference to FIGS. 5 and 6 as well as FIGS. 3 and 4.

Figure 5:
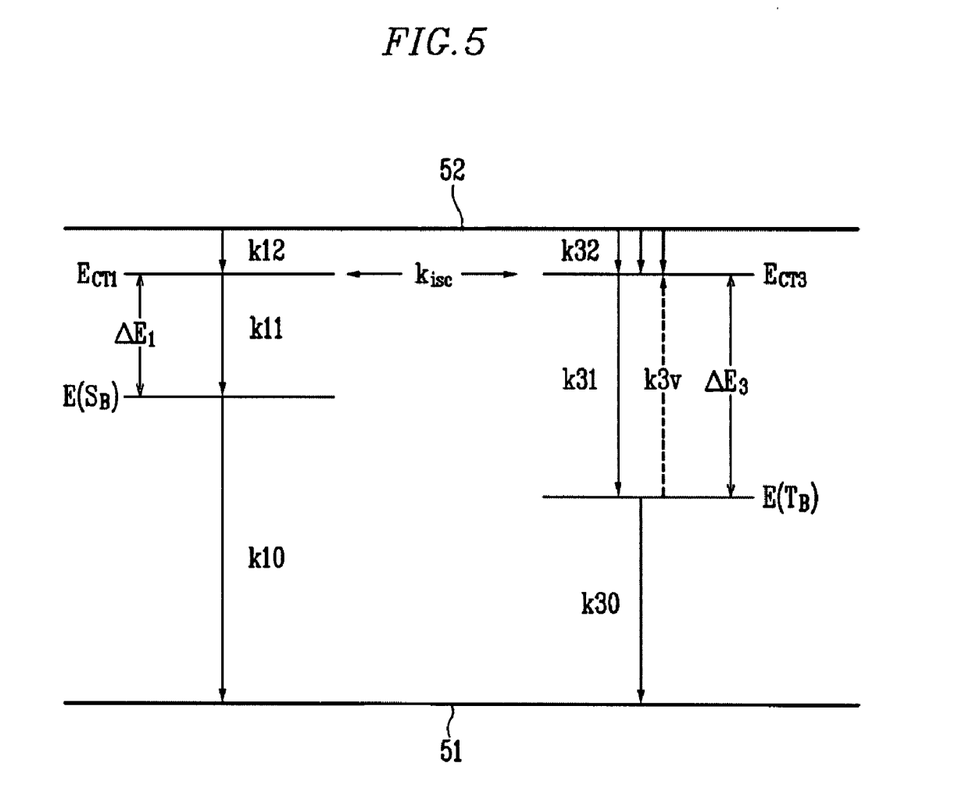
FIG. 5 and FIG. 6 are diagrams showing energy levels of excitons according to an embodiment of the present invention.
Figure 6:
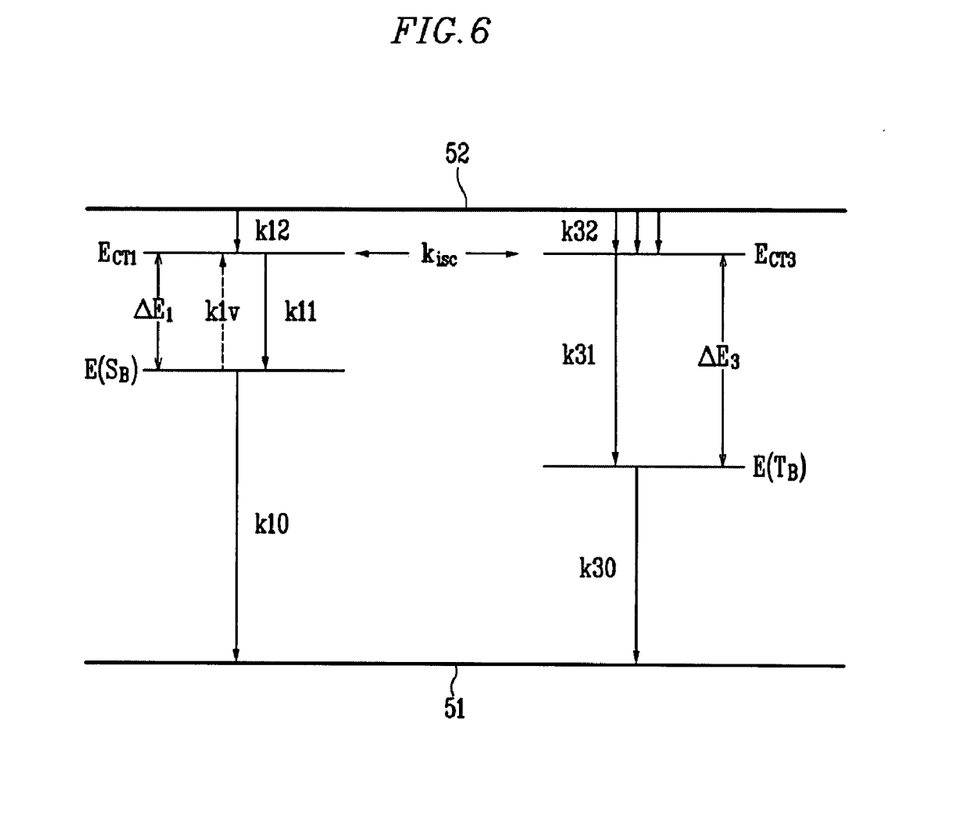

FIG. 5 and FIG. 6 are diagrams showing energy levels of excitons.

In FIGS. 5 and 6, a free energy level 52 is an energy level in which the holes and electrons injected to the lower electrode 30 and the upper electrode 33, respectively, freely move, and a ground energy level 51 is the stable energy level in which the excitons release energy to fall.

As described above, the generation ratio of the singlet excitons to the triplet excitons is quantum-statistically about 1:3, and the generation rate of the singlet excitons and the generation rate of triplet excitons are denoted as k12 and k32, respectively, in FIGS. 5 and 6.

The singlet excitons, generated by the generation rate k12 thereof, are transferred from an energy level $E_{CT1}$ of the singlet charge transfer excitons to an energy level $E(S_B)$ of the singlet bound excitons. A conversion rate of the singlet excitons transferred from the energy level $E_{CT1}$ to the energy level $E(S_B)$ is denoted as an internal conversion rate (k11) of the singlet excitons. The singlet excitons release energy by the difference $\Delta E_1$ (referred to as "internal conversion energy of the singlet excitons") between the energy level $E_{CT1}$ of the singlet charge transfer excitons and the energy level $E(S_B)$ of the singlet bound excitons.

Sequentially, the singlet excitons in the energy level $E(S_B)$ of the singlet bound excitons are transferred by a disappearance rate k10, and thereby the singlet excitons fall to the ground energy level 51 to disappear and generate the fluorescence.

The triplet excitons, generated by the generation rate k32 thereof, are transferred from an energy level $E_{CT3}$ of the triplet charge transfer excitons to an energy level $E(T_B)$ of the triplet bound excitons. A conversion rate of the triplet excitons transferred from the energy level $E_{CT3}$ to the energy level $E(T_B)$ is denoted as an internal conversion rate (k31) of the triplet excitons. The triplet excitons release energy by the difference $\Delta E_3$ (referred to as "internal conversion energy of the triplet excitons") between the energy level $E_{CT3}$ of the triplet charge transfer excitons and the energy level $E(T_B)$ of the triplet bound excitons.

Sequentially, the triplet excitons in the energy level $E(T_B)$ of the triplet bound excitons are transferred by a disappearance rate k30, and thereby the triplet excitons fall to the ground energy level 51 to disappear and generate the phosphorescence.

Since the energy level $E_{CT1}$ of the singlet charge transfer excitons is substantially the same as the energy level $E_{CT3}$ of the triplet charge transfer excitons, singlet excitons having the energy level $E_{CT1}$ or triplet excitons having the energy level $E_{CT3}$ may be transferred to the energy level $E_{CT3}$ or the energy level $E_{CT1}$ by an intersystem crossing rate ($k_{isc}$).

By increasing the intersystem crossing rate ($k_{isc}$), yield of the singlet excitons or the triplet excitons increases.

The increment principle of the yield of the singlet excitons will be described.

As described above, when the triplet excitons lose the internal conversion energy $\Delta E_3$ thereof, the triplet excitons fall from the energy level $E_{CT3}$ of the triplet charge transfer excitons to the energy level $E(T_B)$ of the triplet bound. excitons. On the contrary, when the triplet excitons are supplied with energy by the internal conversion energy $\Delta E_3$ thereof, the triplet excitons may be again excited from the energy level $E(T_B)$ to the energy level $E_{CT3}$.

The second light emitting members 31 generate the excitons and release energy having wavelengths of about 600 nm to about 2500 nm. The energy is transferred to the first light emitting members 32, and then functions as the internal conversion energy $\Delta E_3$ of the triplet excitons that makes the triplet excitons in the energy level $E(T_B)$ excite to the energy level $E_{CT3}$.

As shown in FIG. 5, the triplet excitons having the energy level $E(T_B)$ of the triplet bound excitons are supplied with the internal conversion energy $\Delta E_3$ of the triplet excitons, and thereby the triplet excitons are excited to the energy level $E_{CT3}$ of the triplet charge transfer excitons. At this time, the excitation rate is denoted as reverse internal conversion rate (k3v) of the triplet excitons.

Thereby, the triplet exciton rate that fell from the energy level $E_{CT3}$ to the energy level $E(T_B)$ reduces by the reverse internal conversion rate (k3v) of the triplet excitons.

The triplet excitons excited by the reverse internal conversion rate (k3v) may transfer to the energy level $E_{CT1}$ of the singlet charge transfer excitons due to the intersystem crossing rate ($k_{isc}$), and thereby the transferred excitons may transfer to the energy level $E(S_B)$ of the singlet bound excitons to increase the internal conversion rate (k11) of the singlet excitons.

The increment principle of the yield of the triplet excitons will be described.

Like the case of the triplet excitons, when the singlet excitons lose the internal conversion energy $\Delta E_1$ thereof, the energy level of the singlet excitons falls from the energy level $E_{CT1}$ of the singlet charge transfer excitons to the energy level $E(S_B)$ of the singlet bound excitons. On the contrary, when the singlet excitons are supplied with energy by the internal conversion energy $\Delta E_1$ thereof, the singlet excitons may be again excited from the energy level $E(S_B)$ to the energy level $E_{CT1}$.

The energy that is released from the second light emitting members 31, having wavelengths of about 600 nm to about 2500 nm, is transferred to the first light emitting members 32, and then functions as the internal conversion energy $\Delta E_1$ of the singlet excitons that makes the singlet excitons in the energy level $E(S_B)$ excite to the energy level $E_{CT1}$.

As shown in FIG. 6, the singlet excitons having the energy level $E(S_B)$ of the singlet bound excitons are supplied with the internal conversion energy $\Delta E_1$ of the singlet excitons, and thereby the singlet excitons are excited to the energy level $E_{CT1}$ of the singlet charge transfer excitons. The excitation rate is denoted as reverse internal conversion rate (k1ν) of the singlet excitons.

Thereby, the singlet exciton rate that fell from the energy level $E_{CT1}$ to the energy level $E(S_B)$ reduces by the reverse internal conversion rate (k1ν) of the singlet excitons.

The singlet excitons excited by the reverse internal conversion rate (k1ν) may transfer to the energy level $E_{CT3}$ of the triplet charge transfer excitons due to the intersystem crossing rate ($k_{isc}$), and thereby the transferred excitons may transfer to the energy level $E(T_B)$ of the triplet bound excitons to increase the internal conversion rate (k31) of the triplet excitons.

As described above, by increasing the intersystem crossing rate ($k_{isc}$) that is the rate of excitons transferring from the energy level $E_{CT3}$ of the triplet charge transfer excitons to the energy level $E_{CT1}$ of the singlet charge transfer excitons, or the rate of excitons transferring from the energy level $E_{CT1}$ of the singlet charge transfer excitons to the energy level $E_{CT3}$ of the triplet charge transfer excitons, the yield of the singlet excitons or the triplet exciton increases.

Thereby, since the second light emitting members 31 supply the predetermined energy to the first light emitting members 32, the rate of the singlet excitons or the triplet excitons that function to emit light is increased, and thereby the efficiency of the internal light emission of he OLED is improved.

An OLED according to an embodiment of the present invention will be described in reference to FIGS. 7 to 9.

Figure 7:
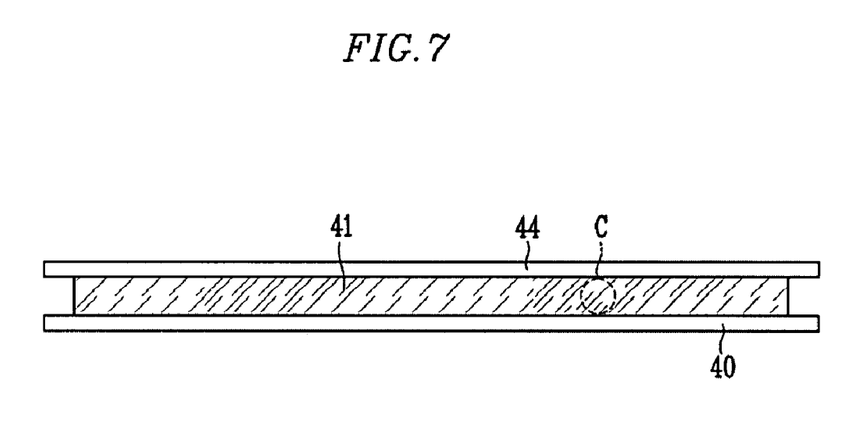
FIG. 7 is a sectional view of a passive matrix OLED according to an embodiment of the present invention.
Figure 8:
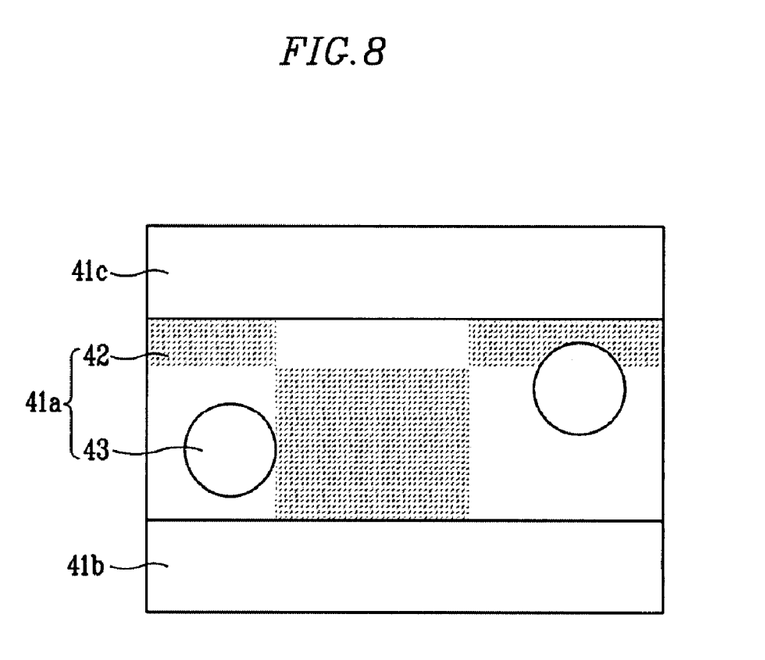
FIG. 8 is an enlarged schematic diagram with respect to portion "C" of the passive matrix OLED shown in FIG. 7 according to an embodiment of the present invention.
Figure 9:
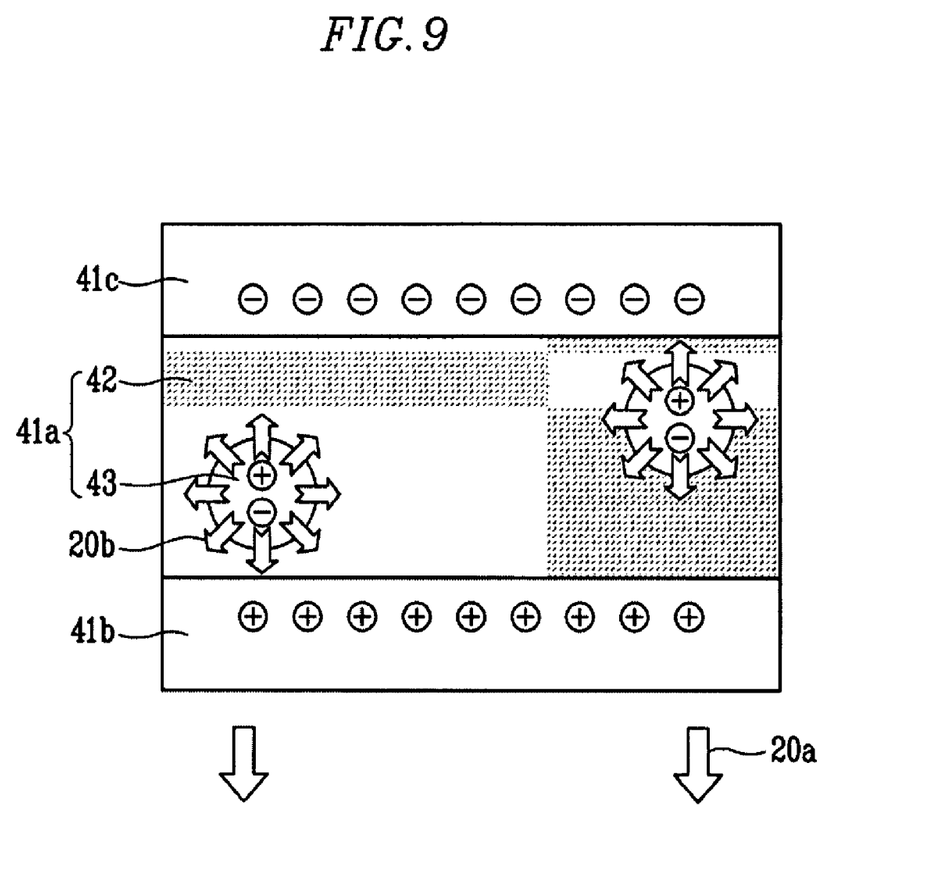
FIG. 9 is a schematic diagram showing the light emitting state of the passive matrix OLED shown in FIGS. 7 and 8 according to an embodiment of the present invention.

FIG. 7 is a sectional view of passive matrix OLED according to an embodiment of the present invention, FIG. 8 is an enlarged schematic diagram with respect to portion "C" of the passive matrix OLED shown in FIG. 7, and FIG. 9 is a schematic diagram showing the light emitting state of the passive matrix OLED shown in FIGS. 7 and 8.

A lower electrode 40 is formed on an insulating substrate (not shown), and a light emitting member 41 is formed on the lower electrode 40.

The light emitting member 41 may be a multi-layered structure including an emitting layer 41a and auxiliary layers 41b and 41c, as shown in FIG. 8.

The emitting layer 41a includes a light emitting material 42 and light emitting impurities 43.

The light emitting material 42 may include an organic material that emits light included in the visible ray spectrum, such as the three primary colors of red, green, and blue, or a mixture of an organic material and an inorganic material. Examples of the materials have been described in connection with the embodiment described in connection with FIG. 1.

The light emitting impurities 43 may be, for example, quantum dots or light emitting pigments.

The quantum dots are a compound that is formed with a spherical shape having a diameter of several tens of nanometers (nm). For example, the compound may be a compound of a group XII element and a group XVI element, a compound of a group XIII element and a group XVI element, or a compound of a group XIV element and a group XVI element. For instance, the quantum dot may have a core structure including compounds such as CdSe, CdTe, ZnS, CdS, PdS, PbSe, or CdHgTe, or a core-shell structure in which quantum dots including a CdSe compound are covered with a compound such as ZnS.

The quantum dots may emit light included in the red spectrum or infrared spectrum having wavelengths of about 600 nm to about 2500 nm based on the internal conversion energy $\Delta E_3$ of the triplet excitons or the internal conversion energy $\Delta E_1$ of the singlet excitons. The wavelength of the emitted light may be defined by the magnitude of the internal conversion energy $\Delta E_3$ and $\Delta E_1$. The wavelengths of the light may be controlled by changing the diameter of the quantum dots. The controlling of the wavelength of the light in accordance with the quantum dots is based on a quantum size effect. As the diameter of the quantum dot becomes smaller, a wavelength of the light emitted from the quantum dot becomes shorter, while as the diameter of the quantum dot becomes larger, a wavelength of the light emitted from the quantum dot becomes larger.

For example, a Pbs compound (the core structure) having a diameter of about 2.3 to about 9.8 nm may emit light having wavelengths of about 850 to about 2100 nm, and a PbSe compound (the core structure) having a diameter of about 4.5 to about 9 nm may emit light having wavelengths of about 1200 to about 2340 nm. A CdSe/ZnS compound (the core-shell structure) having a diameter of about 1.9 to about 6.7 nm may emit light having wavelengths of about 465 to about 640 nm. By adding the light emitting pigments to the emitting layer 41a, it is possible to obtain light having a predetermined wavelength by solvatochromism due to an interaction of the electric dipole moment of pigment molecules and the light emitting material 42 of the emitting layer 41a. Thereby, light included in the red or infrared ray spectrum having wavelengths of about 600 nm to about 2500 nm by the internal conversion energy $\Delta E_3$ of the triplet excitons or the internal conversion energy $\Delta E_1$ of the singlet excitons may be emitted by controlling the kind and concentration of the light emitting pigment.

The light emitting pigments may be laser dyes. Products of the laser dyes made for sale by, for example, Exciton, Inc., may be S-14, LDS-925/S-13, LDS-867, LDS-860, IR 140, IR 144, IR-125, HITC, DTTC, HIDC, LDS-821, LDS-798, DOTC, LDS-765, Ox-750, LDS-759, LDS-751, LDS-750, LDS-730, LD-800, LD-700, Ox-725, LDS-722, LDS-720, Ox-720, NB-690, LD-690, LD-688, LDS-698, LDS-DODC, CV-670, DCM, SR-640, R-640, P-650, KR-620, R-610, or R-59.

The light emitting impurities 42 such as quantum dots or light emitting pigments are mixed with the light emitting material 42. For example, after dissolving the light emitting material 42 and the light emitting impurities 43 in a solvent, the emitting layer 41a may be formed by a solution process such as a spin coating process, a slit coating process, and an inkjet printing process.

The lower auxiliary layer 41b may be a hole transport layer and/or a hole injection layer, and the upper auxiliary layer 41c may be an electron transport layer and/or an electron injection layer.

An upper electrode 44 made of a material such as Al, Ca, or Ba is formed on the light emitting member 41.

In the structure, when voltages are applied to the lower electrode 40 and the upper electrode 44, respectively, holes (⊕) are injected from the lower electrode 40 to the emitting layer 41a, and electrons (⊖) are injected from the upper electrode 44 to the emitting layer 41a.

The injected holes and electrons are combined in the emitting layer 41a to generate excitons, and the excitons release energy in the form of emitted light 20a included in the visible ray spectrum.

The holes and electrons injected to the light emitting impurities 43 in the emitting layer 41a are combined to generate excitons, and the excitons release energy in the form of emitted light 20b having wavelengths of about 600 nm to about 2500 nm. The released energy is transferred to the light emitting material 42 to improve the yield of the singlet excitons or the triplet excitons.

Like the second light emitting members 31, the light emitting impurities 43 release energy in the form of emitted light having wavelengths of about 600 nm to about 2500 nm, and the released energy is transferred to the light emitting material 42. Since the contact size of the light emitting impurities 43 and the light emitting material 42 is large, it is desirable to transfer the energy. The energy corresponds to the internal conversion energy $\Delta E_3$ or $\Delta E_1$ of the triplet or singlet excitons, and thereby the yield of the singlet excitons or triplet excitons increases to improve the efficiency of internal light emission of the OLED.

OLEDs having the above-described structures of the embodiments described in connection with FIGS. 1 and 7, exhibited a change in yield of the excitons when the first light emitting members 32 or the emitting layer 41a are supplied with energy by the internal conversion energy $\Delta E_3$ of the triplet excitons. The result of the yield change is shown in FIG. 10.

Figure 10:
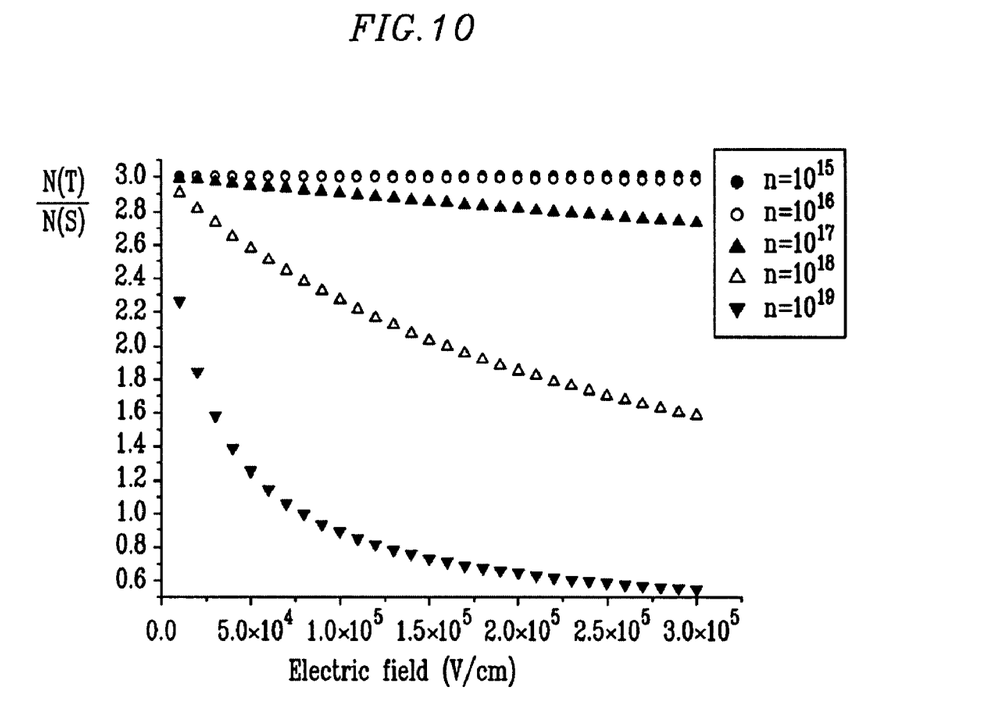
FIG. 10 is a graph representing the ratio of the number of singlet excitons and the number of triplet excitons in accordance with electric field strength in a passive matrix OLED according to an embodiment of the present invention.

FIG. 10 is a graph representing the ratio of the number of singlet excitons and the number of triplet excitons in accordance with electric field strength in a passive matrix OLED according to an embodiment of the present invention.

Here, N(S) is the number of singlet excitons, N(T) is the number of triplet excitons, and n is the number of light emitting impurities 43 for every unit of volume.

As shown in FIG. 10, as the strength of the electric field becomes stronger, the ratio of the number of triplet excitons/ the number of singlet excitons decreases. This means that as the strength of the electric field becomes stronger, the reverse internal conversion rate (k3v) of the triplet excitons is increased, and thereby the number of triplet excitons decreases and the number of singlet excitons increases. Moreover, the increment width of the singlet excitons increases as the number of light emitting impurities for every unit of volume increases.

Therefore, as a predetermined energy is supplied to an organic emitting layer, the yield of the excitons increases.

An OLED according to an embodiment of the present invention will be described with reference to FIGS. 11 to 14. The OLED of this embodiment is an active matrix OLED.

Figure 11:
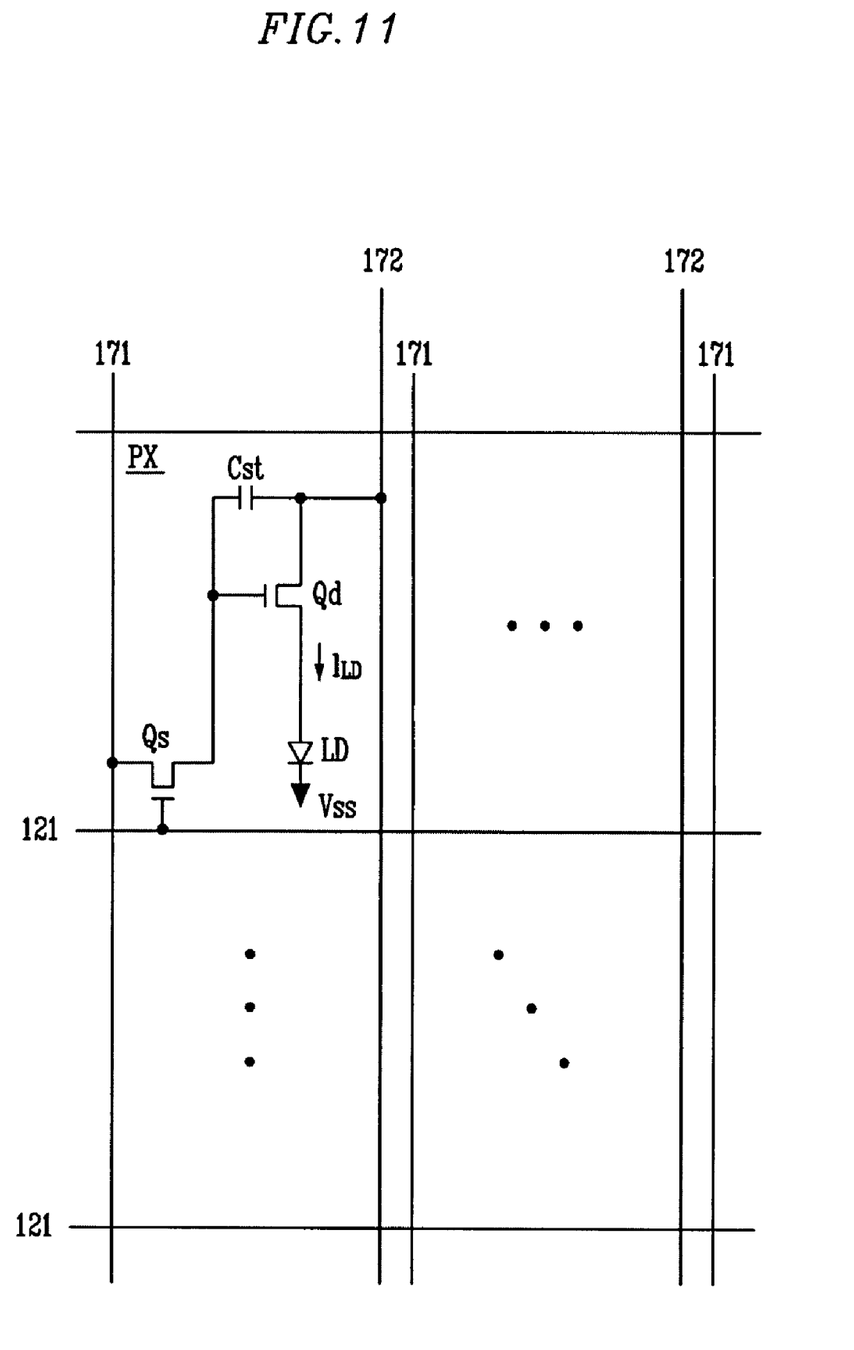
FIG. 11 is an equivalent circuit diagram of an active matrix OLED according to an embodiment of the present invention.

FIG. 11 is an equivalent circuit diagram of an active matrix OLED according to an embodiment of the present invention.

Referring to FIG. 11, an OLED according to this embodiment includes a plurality of signal lines 121, 171, and 172, and a plurality of pixels PX connected thereto and arranged substantially in a matrix.

The signal lines include a plurality of gate lines 121 transmitting gate signals (or scanning signals), a plurality of data lines 171 transmitting data signals, and a plurality of driving voltage lines 172 transmitting a driving voltage. The gate lines 121 extend substantially in a row direction and substantially parallel to each other, while the data lines 171 and the driving voltage lines 172 extend substantially in a column direction and substantially parallel to each other.

Each pixel PX includes a switching transistor Qs, a driving transistor Qd, a capacitor Cst, and an organic light emitting diode LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to the gate signal applied to the gate line 121.

The driving transistor Qd has a control terminal connected to the switching transistor Qs, an input terminal connected to the driving signal line 172, and an output terminal connected to the organic light emitting diode LD. The driving transistor Qd drives an output current $I_{LD}$ having a magnitude depending on the voltage between the control terminal and the output terminal thereof.

The capacitor Cst is connected between the control terminal and the output terminal of the driving transistor Qd. The capacitor Cst stores the data signal applied to the control terminal of the driving transistor Qd and maintains the data signal after the switching transistor Qs turns off.

The organic light emitting diode LD has an anode connected to the output terminal of the driving transistor Qd and a cathode connected to a common voltage Vss. The organic light emitting diode LD emits light having an intensity depending on an output current $I_{LD}$ of the driving transistor Qd, thereby displaying images.

The switching transistor Qs and the driving transistor Qd are n-channel field effect transistors (FETs). However, at least one of switching transistor Qs and the driving transistor Qd may be a p-channel FET. In addition, the connections among the transistors Qs and Qd, the capacitor Cst, and the organic light emitting diode LD may be modified.

Figure 12:
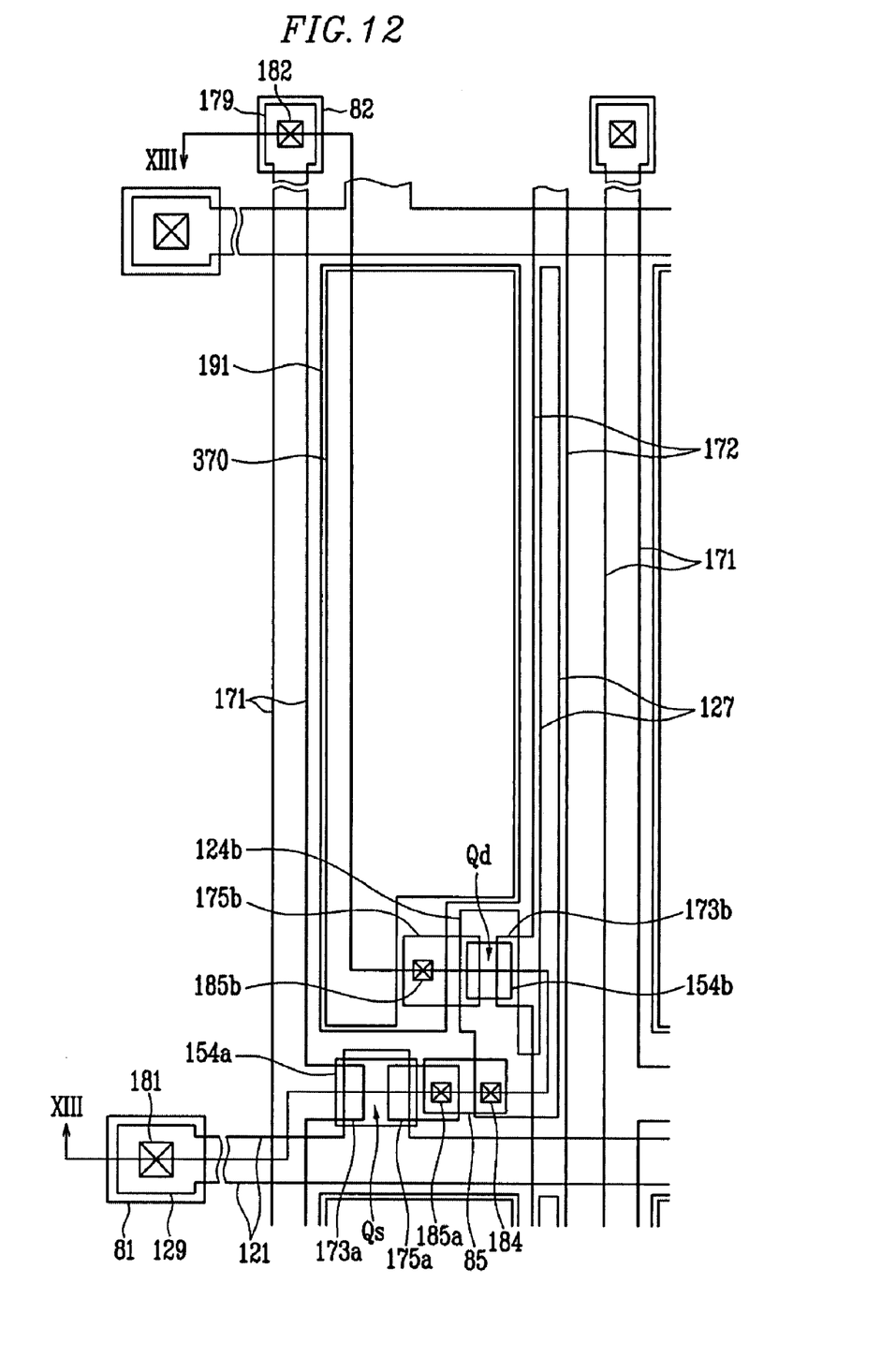
FIG. 12 is a layout view of the OLED shown in FIG. 11 according to an embodiment of the present invention.
Figure 13:
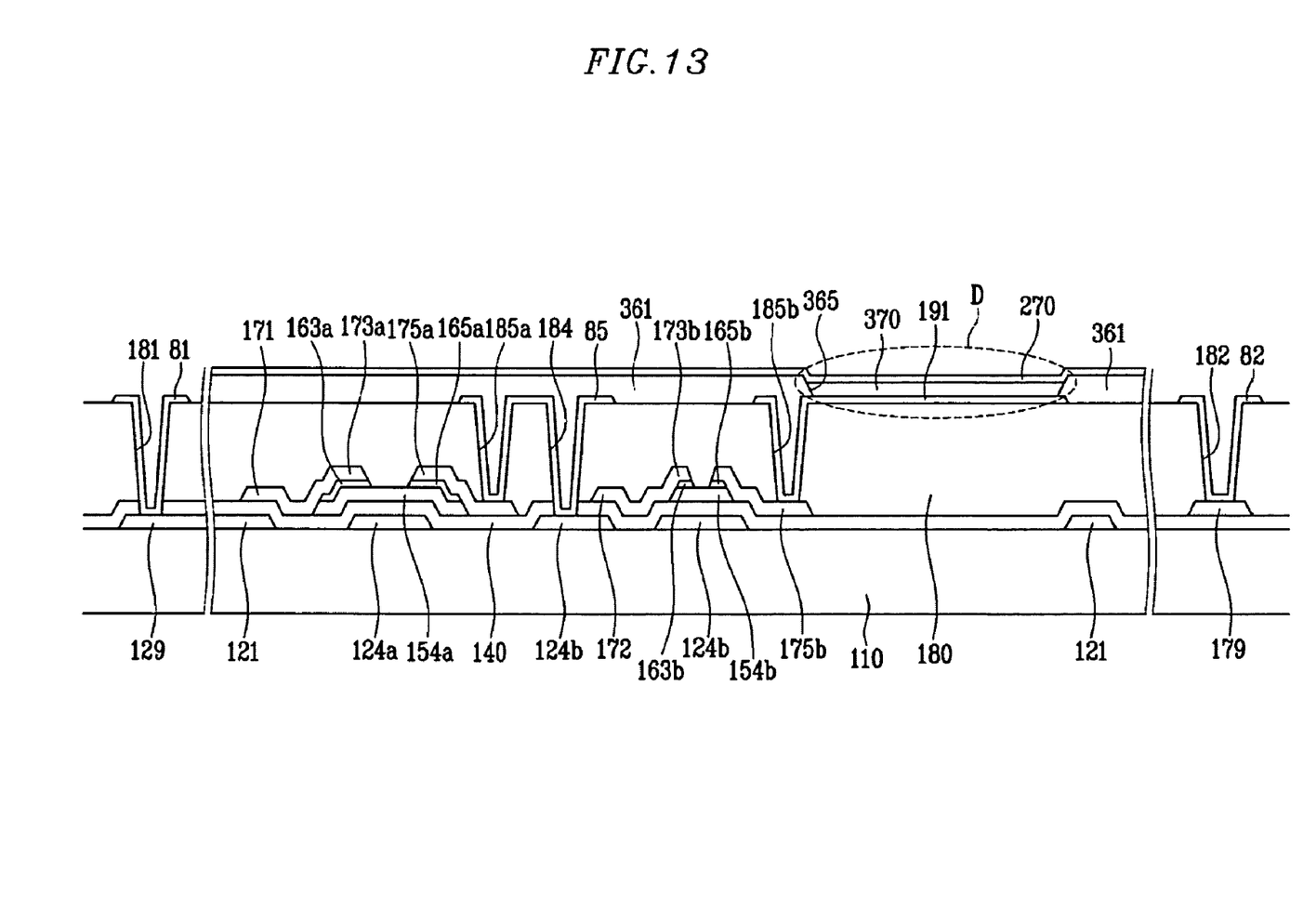
FIG. 13 is a sectional view of the OLED shown in FIG. 12 taken along the lines XIII-XIII according to an embodiment of the present invention.
Figure 14:
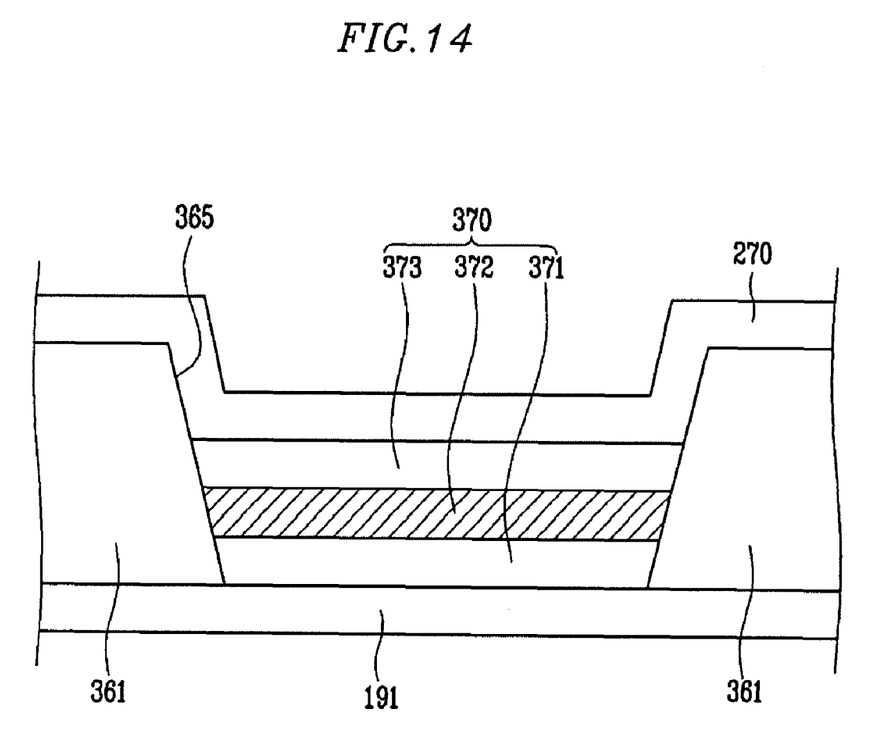
FIG. 14 is an enlarged schematic diagram with respect to a "D" portion of the OLED shown in FIG. 13 according to an embodiment of the present invention.

Referring to FIGS. 12 to 14, a more detailed structure of the OLED shown in FIG. 11 according to an embodiment of the present invention will be described.

FIG. 12 is a layout view of the OLED shown in FIG. 11, FIG. 13 is a sectional view of the OLED shown in FIG. 12 taken along the lines XIII-XIII, and FIG. 14 is an enlarged schematic diagram with respect to portion "D" of the OLED shown in FIG. 13.

A plurality of gate conductors that include a plurality of gate lines 121 including first control electrodes 124a and a plurality of second control electrodes 124b including storage electrodes 127 are formed on an insulating substrate 110 made of a material such as transparent glass or plastic.

The gate lines 121 for transmitting gate signals extend substantially in a transverse direction. Each gate line 121 further includes an end portion 129 having a large area for contact with another layer or an external driving circuit, and the first control electrodes 124a project upward from the gate line 121. The gate lines 121 may extend to be directly connected to a gate driving circuit (not shown) for generating the gate signals, which may be integrated with the substrate 110.

Each of the second control electrodes 124b is separated from the gate lines 121 and includes the storage electrode 127 extending in a direction.

The gate conductors 121 and 124b include, for example, an Al-containing metal such as Al and an Al alloy, a Ag-containing metal such as Ag and a Ag alloy, a Cu-containing metal such as Cu and a Cu alloy, a Mo-containing metal such as Mo and a Mo alloy, Cr, Ta, or Ti. The gate conductors 121 and 124b may have a multi-layered structure including two films having different physical characteristics.

The lateral sides of the gate conductors 121 and 124b are inclined relative to a surface of the substrate 110, and the inclination angle thereof is in a range from about 30 to about 80 degrees.

A gate insulating layer 140 including, for example, silicon nitride (SiNx) or silicon oxide (SiOx) is formed on the gate conductors 121 and 124b.

A plurality of first and second semiconductor islands 154a and 154b including, for example, hydrogenated amorphous silicon (abbreviated to "a-Si") or polysilicon, are formed on the gate insulating layer 140. The first and second semiconductor islands 154a and 154b are disposed on the first and second control electrodes 124a and 124b, respectively.

A plurality of pairs of first ohmic contact islands 163a and 165a and a plurality of pairs of second ohmic contact islands 163b and 165b are formed on the first and second semiconductor islands 154a and 154b, respectively. The ohmic contacts 163a, 163b, 165a, and 165b include, for example, silicide or n+ hydrogenated a-Si heavily doped with an n-type impurity such as phosphorous. The first ohmic contacts 163a and 165a are located in pairs on the first semiconductor islands 154a, and the second ohmic contacts 163b and 165b are located in pairs on the second semiconductor islands 154b.

A plurality of data conductors including a plurality of data lines 171, a plurality of driving voltage lines 172, and a plurality of first and second output electrodes 175a and 175b are formed on the ohmic contacts 163a, 163b, 165b, and 165b and the gate insulating layer 140.

The data lines 171 for transmitting data signals extend substantially in the longitudinal direction and intersect the gate lines 121. Each data line 171 includes a plurality of first input electrodes 173a extending toward the first control electrodes 124a and an end portion 179 having a large area for contact with another layer or an external driving circuit. The data lines 171 may extend to be directly connected to a data driving circuit (not shown) for generating the data signals, which may be integrated with the substrate 110.

The driving voltage lines 172 for transmitting driving voltages extend substantially in the longitudinal direction and intersect the gate lines 121. Each driving voltage line 172 includes a plurality of second input electrodes 173b extending toward the second control electrodes 124b. The driving voltage lines 172 overlap the storage electrodes 127.

The first and second output electrodes 175a and 175b are separated from each other and from the data lines 171 and the driving voltage lines 172. Each pair of the first input electrodes 173a and the first output electrodes 175a are disposed opposite each other with respect to a first control electrode 124a, and each pair of the second input electrodes 173b and the second output electrodes 175b are disposed opposite each other with respect to a second control electrode 124b.

The data conductors 171, 172, 175a, and 175b include, for example, a refractory metal including Mo, Cr, Ta, Ti, or alloys thereof. The data conductors 171, 172, 175a, and 175b may have a multi-layered structure including, for example, a refractory metal film and a low resistivity film.

Like the gate conductors 121 and 124b, the data conductors 171, 172, 175a, and 175b have inclined edge profiles, and the inclination angles thereof are in a range of about 30 to about 80 degrees.

The ohmic contacts 163a, 163b, 165b, and 165b are interposed between the underlying semiconductor islands 154a and 154b and the overlying data conductors 171, 172, 175a, and 175b and reduce the contact resistance therebetween. The semiconductor islands 154a and 154b include a plurality of exposed portions, which are not covered with the data conductors 171, 172, 175a, and 175b, such as portions disposed between the input electrodes 173a and 173b and the output electrodes 175a and 175b.

A passivation layer 180 is formed on the data conductors 171, 172, 175a, and 175b and the exposed portions of the semiconductor islands 154a and 154b. The passivation layer 180 may include an inorganic or an organic insulator, and may have a flat top surface.

The passivation layer 180 has a plurality of contact holes 182, 185a, and 185b exposing the end portions 179 of the data lines 171, the first output electrodes 175a, and the second output electrodes 175b, respectively. The passivation layer 180 and the gate insulating layer 140 have a plurality of contact holes 181 and 184 exposing the end portions 129 of the gate lines 121 and the second control electrodes 124b, respectively.

A plurality of pixel electrodes 191, a plurality of connecting members 85, and a plurality of contact assistants 81 and 82 are formed on the passivation layer 180, and may include a transparent conductor such as ITO or IZO, or a reflective conductor such as Al, Ag or alloys thereof.

The pixel electrodes 191 are connected to the second output electrodes 175b through the contact holes 185b.

The connecting members 85 are connected to the second control electrodes 124b and the first output electrodes 175a through the contact holes 184 and 185b, respectively.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

A partition 361 is formed on the passivation layer 180. The partition 361 surrounds the pixel electrodes 191 like a bank to define openings 365, and the partition 361 includes, for example, an organic or inorganic insulating material. The partition 361 may include, for example, a photosensitive material containing black pigment so that the black partition 361 may serve as a light blocking member and the formation of the partition 361 may be simplified.

A plurality of light emitting members 370 are formed on the pixel electrodes 191 and confined in the openings 365 defined by the partition 361.

Each of the light emitting members 370 has a multilayered structure including an emitting layer 372 and auxiliary layers 371 and 373 for improving the efficiency of light emission of the emitting layer 372.

The auxiliary layer 371 may be a hole transport layer and/or a hole injection layer, and the auxiliary layer 373 may be an electron transport layer and/or an electron injection layer.

The emitting layer 372 may include first light emitting members or a light emitting material emitting light having a wavelength included in the visible ray spectrum and second light emitting members or light emitting impurities emitting light having a wavelength included in the long wavelength spectrum, as described in connection with the above embodiments. As described above, the first light emitting members or a light emitting material transfers energy from the second light emitting members or the light emitting impurities to improve the efficiency of internal light emission.

A common electrode 270 is formed on the light emitting members 370 and the partition 361.

An encapsulation layer (not shown) may be formed on the common electrode 270. The encapsulation layer encapsulates the light emitting members 370 and the common electrode 270 to prevent moisture and/or oxygen from entering from the outside.

A first control electrode 124a connected to a gate line 121, a first input electrode 173a connected to a data line 171, and a first output electrode 175a along with a first semiconductor island 154a form a switching TFT Qs having a channel formed in the first semiconductor island 154a disposed between the first input electrode 173a and the first output electrode 175a. Likewise, a second control electrode 124b connected to a first output electrode 175a, a second input electrode 173b connected to a driving voltage line 172, and a second output electrode 175b connected to a pixel electrode 191 along with a second semiconductor island 154*b* form a driving TFT Qd having a channel formed in the second semiconductor island 154*b* disposed between the second input electrode 173*b* and the second output electrode 175*b*. For increasing driving current, a channel width of the driving thin film transistor Qd may be increased or a channel length thereof may be shortened.

A pixel electrode 191, a light emitting member 370, and the common electrode 270 form an organic light emitting diode LD having the pixel electrode 191 as an anode and the common electrode 270 as a cathode, or vice versa. The overlapping portions of a storage electrode 127 and a driving voltage line 172 form a storage capacitor Cst.

The semiconductor islands 154*a* and 154*b*, if made of polysilicon, may include intrinsic regions (not shown) disposed under the gate electrodes 124*a* and 124*b* and extrinsic regions (not shown) disposed opposite each other with respect to the intrinsic regions. The extrinsic regions are electrically connected to the input electrodes 173*a* and 173*b* and the output electrodes 175*a* and 175*b*, and the ohmic contacts 163*a*, 163*b*, 165*a*, and 165*b* may be omitted.

The gate electrodes 124*a* and 124*b* may be disposed over the semiconductor islands 154*a* and 154*b*, while the gate insulating layer 140 is interposed between the semiconductor islands 154*a* and 154*b* and the gate electrodes 124*a* and 124*b*. The data conductors 171, 172, 173*b*, and 175*b* may be disposed on the gate insulating layer 140 and electrically connected to the semiconductor islands 154*a* and 154*b* through the contact holes (not shown) in the gate insulating layer 140. Alternatively, the data conductors 171, 172, 173*b*, and 175*b* may be disposed under the semiconductor islands 154*a* and 154*b* and may electrically contact the semiconductor islands 154*a* and 154*b*.

As described above, by applying energy to the emitting layer, the generation rate of the excitons participating in light emission increases, and thereby the efficiency of internal light emission of OLEDs is improved.

While this invention has been described in connection with the exemplary embodiments, it is to be understood that the invention is not limited to the disclosed embodiments, but is intended to cover various modifications and equivalent arrangements included within the spirit and scope of the appended claims.

What is claimed is:

1. An organic light emitting device comprising:
   a first electrode formed on a substrate;
   a second electrode facing the first electrode;
   first light emitting members disposed between the first electrode and the second electrode and emitting light in a visible spectrum; and
   second light emitting members in contact with the first light emitting members and releasing energy in the form of emitted light having a wavelength,
   wherein the released energy is transmitted to the first light emitting members,
   wherein the wavelength is in a range of about 600 nm to about 2500 nm, and
   wherein the first light emitting members comprise an organic red light emitting member and are made of a different material from the second light emitting members.

2. The organic light emitting device of claim 1, wherein the second light emitting members are formed in parallel to one of the first electrode and the second electrode.

3. The organic light emitting device of claim 2, wherein the first light emitting members are disposed between neighboring second light emitting members.

4. The organic light emitting device of claim 3, wherein each of the second light emitting members comprises a compound semiconductor.

5. The organic light emitting device of claim 4, wherein the compound semiconductor comprises at least one of InN, GaAs, GaInAs, InP, GaSb, $(Al_xGa_{1-x})_{0.5}In_{0.5}P$, $(Al_xGa_{1-x})_yIn_{1-y}P$, $Al_xIn_{1-x}P$, and $Ga_xIn_1$.

6. The organic light emitting device of claim 5, wherein each of the second light emitting members further comprises a first auxiliary layer disposed between the first electrode and the compound semiconductor and a second auxiliary layer disposed between the second electrode and the compound semiconductor.

7. The organic light emitting device of claim 6, wherein the first auxiliary layer comprises at least one of B, Al, Ga, In, and Tl, and the second auxiliary layer comprises at least one of N, P, As, Sb, and Bi.

8. The organic light emitting device of claim 1, wherein the first light emitting members and the second light emitting members are in a mixed configuration.

9. The organic light emitting device of claim 8, wherein each of the second light emitting members comprises a light emitting impurity.

10. The organic light emitting device of claim 9, wherein the light emitting impurity comprises a quantum dot or a light emitting pigment.

11. The organic light emitting device of claim 10, wherein the quantum dot comprises at least one of CdSe, CdTe, ZnS, CdS, PdS, PbSe, and CdHgTe.

12. The organic light emitting device of claim 10, wherein the first light emitting members and the second light emitting members are formed by a solution process.

13. The organic light emitting device of claim 1, further comprising:
   first and second signal lines intersecting each other;
   a first thin film transistor connected to the first and second signal lines; and
   a second thin film transistor connected to the first thin film transistor and the first electrode,
   wherein the first and second signal lines and the first and second thin film transistors are formed between the substrate and the first electrode.

* * * * *